United States Patent [19]
Bakowski et al.

[11] Patent Number: 5,801,836
[45] Date of Patent: Sep. 1, 1998

[54] DEPLETION REGION STOPPER FOR PN JUNCTION IN SILICON CARBIDE

[75] Inventors: Mietek Bakowski, Skultuna; Ulf Gustafsson, Linkoping, both of Sweden

[73] Assignee: ABB Research Ltd., Zurich, Switzerland

[21] Appl. No.: 680,921

[22] Filed: Jul. 16, 1996

[51] Int. Cl.$^6$ .................. H01L 23/58; H01L 29/861
[52] U.S. Cl. .................. 257/487; 257/77; 257/655; 257/657
[58] Field of Search .................. 257/487, 492, 257/493, 77, 490, 495, 629, 655, 657

[56] References Cited

U.S. PATENT DOCUMENTS

| | | | |
|---|---|---|---|
| 4,648,174 | 3/1987 | Temple et al. | 438/514 |
| 4,750,025 | 6/1988 | Chen et al. | 257/198 |
| 4,750,028 | 6/1988 | Ludikhuize | 257/495 |
| 5,041,896 | 8/1991 | Temple et al. | 257/496 |
| 5,093,693 | 3/1992 | Abbas et al. | 257/106 |
| 5,113,237 | 5/1992 | Stengl | 257/494 |
| 5,155,574 | 10/1992 | Yamaguchi | 257/257 |
| 5,345,101 | 9/1994 | Tu | 257/495 |

FOREIGN PATENT DOCUMENTS

| | | |
|---|---|---|
| 06268202 A | 9/1994 | Japan . |
| WO 95/32524 | 11/1995 | WIPO . |
| WO 96/03774 | 2/1996 | WIPO . |

OTHER PUBLICATIONS

Kazuya, Amplification-Type Solid Image Pickup Element and its Manufacturing Method, Patent Abstracts of Japan, vol. 96, No. 5 Abstract of JP 8–18024 A (Sony Corp.), 1996.

*Primary Examiner*—Jerome Jackson
*Assistant Examiner*—John Guay
*Attorney, Agent, or Firm*—Pollock, Vande Sande & Priddy

[57] ABSTRACT

A semiconductor component comprises a pn junction having a first conductivity type layer and a second conductivity type layer, both being doped layers of silicon carbide (SiC), the first conductivity type layer being lower doped and being provided with a depletion region stopper (DRS) located outside the pn junction, the DRS having stepwise or continuously increasing effective sheet charge density of the first conducting type in a radial direction towards the outer edge of the semiconductor component.

8 Claims, 3 Drawing Sheets

DEPLETION REGION STOPPER FOR PN JUNCTION IN SILICON CARBIDE

TECHNICAL FIELD

The invention is related to a semiconductor component with silicon carbide as the base material, wherein the component comprises at least one pn junction, and wherein a risk of voltage breakdown due to a strong electric field at the edge of the junction is reduced when the pn junction contains a depletion region stopper design on a low doped side of the junction and outside the edge of the junction.

BACKGROUND OF THE INVENTION

Semiconductor components having silicon carbide as the base material are continuously developed to be used in connection with high temperatures, high power applications, and under high radiation conditions. Under such circumstances, conventional semiconductors do not work, satisfactorily. Evaluations indicate that SiC semiconductors of power MOSFET-type, and diode rectifiers based on SiC, are able to operate over a greater voltage and temperature interval, e.g., up to 650°–800° C., and show better switching properties such as lower losses and higher working frequencies and still have a volume 20 times smaller than corresponding silicon components. These possible improvements are based on the favorable material properties that silicon carbide possesses in relation to silicon, such as e.g., a higher breakdown field (up to 10 times higher than silicon), a higher thermal conductivity (more than 3 times higher than silicon) and a higher energy band gap (2.9 eV for 6H-SiC, one of the crystal structures of SiC).

As SiC semiconductor technology is relatively recent and in many aspects not fully developed, there are many critical manufacturing problems that remain to be solved before SiC semiconductor devices may be realized experimentally and manufactured in large quantities. This is especially true of components intended for use in high power and high-voltage applications.

One of the difficulties to be overcome when manufacturing high voltage diodes or other types of semiconductor components comprising a voltage absorbing pn junction is to produce a proper junction termination at the edge of the junction. The electric field at the periphery of the junction is normally enhanced compared to the electric field in the bulk of the junction. This field increase at the periphery of the junction may be further reinforced in the presence of surface charge.

A high electric field at the edge of the pn junction implies a great risk of voltage breakdown or flash-over at the edge of the junction and results in instability of the blocking voltage known as voltage drift.

To avoid those disadvantages, it is very important to reduce the field concentration where the junction reaches the surface. Combined with efforts to passivate the surface of the component, measures are taken to flatten the electric field at the surface, e.g., by acting on how the pn junction emerges at the surface. As an example, it is known from silicon power components to lap (grind, sandblast or etch) the surface of the edge to a certain angle in relation to the pn junction to thereby flatten the field. Another known technique is to gradually decrease the doping on the highly doped side of the junction, so that the doping is reduced towards the outermost edge of the junction (so called Junction Termination Extension, JTE). The methods, known from silicon technology, used to achieve a JTE of an Si component are difficult, or almost impossible, to apply to components based on silicon carbide due to the great hardness of the material and the extremely low diffusivity of proper SiC dopants.

The use of SiC also presents a new challenge with respect to the stability and quality of the surface of the component. Normally, a semiconductor has to be passivated in order to stabilize it with respect to charge properties. The quality of the surface is determined by the surface charge given by the fixed charge, mobile charge, and interface charge densities. The values for all such quantities are low for Si devices and surface charge is predominantly positive for oxidized Si surfaces. The surface charge density for Si components is normally, in the range of $10^{10}$–$10^{11}$ cm$^{-2}$. When SiC is used as the semiconductor material, the surface and interface properties between the SiC surface and a proposed passivation material like silicon dioxide are still not fully understood and controlled. Large values of surface charge, both positive and negative charges of the order of magnitude of more than $1 \cdot 10^{12}$ cm$^{-2}$ are frequently observed at such interfaces. Moreover, surface charge cannot be expected to be sable in time under stress inflicted on a device during operation.

Many of the problems to be solved when developing semiconductor components from SiC are reminiscent of those prevalent at the beginning of the development of corresponding silicon components. Yet, the same techniques as those applicable to silicon cannot be utilized when solving the specific problems related to production of SiC semiconductor components. As an example, doping through diffusion is not feasible for SiC, as diffusion coefficients are negligible below 2270° K. Also, ion implantation of doping elements, a common technique when manufacturing Si components, is difficult to master and not yet fully developed for SiC.

The electric field may be reduced at the edge of the pn junction by applying a semi-isolating layer to the edge of the junction of an SiC component. Such a solution is described in document PCT/SE94/00482.

No method or device to accomplish a semiconductor component corresponding to the principle of Junction Termination Extension at a pn junction composed of Si is known in the prior art for a component, where SiC constitutes the base material of the junction. Solutions for arriving at SiC components comprising pn junctions with JTEs are described in U.S. patent application Ser. No. 08/520,689, which is hereby incorporated by reference. This application discloses MESA structure pn junctions having Junction Termination Extensions.

Junction termination using gradually diminishing doping on the highly doped side of the pn-junction at the periphery of the pn junction is an effective way to secure blocking capability for high voltage semiconductors. JTE techniques for SiC pn junctions have been described for mesa-structures in U.S. patent application Ser. No. 08/520,689. The solutions described there involve stepwise decreasing charges of the JTE towards the edge of the JTE by use of an etch-down technique, epitaxial regrowth, or ion implantation in order to control the surface doping and surface fields.

A JTE for a pn junction consisting, e.g., of a highly doped p-layer and a low doped n-layer, where the JTE constitutes an extension of the high doped p-layer, is sensitive to negative surface charge at the surface of the low doped n-layer. This is due to an extension of the depletion region laterally at the surface of the low doped n-layer away from the edge of the junction when the pn junction is reverse biased. A corresponding situation, of course, prevails for a pn junction with the opposite type of conducting layers, but the sign of the surface charge is reversed. The depletion region must not reach the edge of the component during voltage blocking by the pn junction. This may be solved by introduction of an n+-stop in the case as discussed, where the low doped side of the junction is of n-conducting type, and negative surface charge exists at the surface. Such an n+-stop may be used for defining the border of the component. Simulations show that at negative surface charge densities in excess of $10^{12}$ cm$^{-2}$, the depletion region (indicated by the line Depletion Region Limit, DRL, in FIG. 1) is shifted towards the n+-stop so that a high electric field region with a high field peak (FIG. 2) is developed at the n+-stop, whereby the depletion region is no longer confined to the edge of the junction itself or to the JTE area. In such a case, where an n+-stop (or p+-stop) is used for the ultimate termination of the junction, the high electric field arising at the n+-stop may now become the critical location for a voltage breakdown during a high reverse voltage across the pn junction.

High concentration of surface charge can be characteristic of a processed and passivated SiC surface, or a result of a long term instability and stress-induced charging of the interface. No methods to secure a proper termination of the space charge and to limit the lateral extension of the device, while at the same time solving the problem with arising electric field peaks are known in the art.

The present invention aims at providing a depletion region stopper reducing the electric field arising, when a stopper is introduced for handling problems with surface charge at the low doped layer of the junction.

The term "SiC" is used in the following description to refer to any of the principal crystal polytypes of this material known as 6H, 4H, 2H, 3C and 15R.

SUMMARY OF THE INVENTION

One embodiment of the invention is composed of a semiconductor component, which comprises a pn junction, wherein both the p-conducting and the n-conducting layers of the pn junction constitute doped silicon carbide layers and wherein a Depletion Region Stopper (a DRS) as a termination of the junction on the lower doped of the conducting layers exhibits a charge profile with increasing total charge and/or effective sheet charge density following a radial direction from the central part of the junction towards the outermost edge of the DRS.

Other embodiments of the invention comprise methods for producing the SiC semiconductor component with the increasing charge profile.

A problem with high concentrations of surface charge of the same polarity as the conducting type of the surface layer, e.g., negative surface charge prevailing at the surface of an n-type layer, is overcome by use of a specially designed Depletion Region Stopper, DRS, as described below. It has been experimentally confirmed that very high concentrations of negative surface charge in the order of $1 \cdot 10^{13}$ cm$^{-2}$ may, in this instance, appear at the surface of a grown n-type wafer. A junction termination for the purpose of securing a stable blocking voltage level in situations where surface charge concentrations of both polarities occur, and where the surface charge may be in excess of $2 \cdot 10^{12}$ cm$^{-2}$, should be provided with a properly designed junction and a JTE as mentioned, and also the Depletion Region Stopper, DRS, according to an embodiment of this invention.

By manufacturing an SiC semiconductor component having the features described the concentration of the electric field, when a high reverse voltage is applied to the pn junction, is eliminated as the electric field is flattened along the Depletion Region Stopper (FIG. 3). A low electric field in the lateral direction is also achieved. Hence, the risk of a voltage breakdown as the DRS area of the junction before a breakdown somewhere in the defined main area of the junction is reduced. By forming the ultimate termination of a pn junction of SiC material with a structure according to the invention, the reverse voltage over the junction may be considerably increased (3 times and more) before breakdown occurs, thus making it possible to produce SiC pn junction with a DRS withstanding a reverse voltage of 4.5 kV, or more, independently of existing surface charge as earlier mentioned. The Depletion Region Stopper may be used for a pn junction independently of whether the junction is equipped with a Junction Termination Extension or not. In case of the surface outside an existing JTE having a negative surface charge more than $2 \cdot 10^{12}$ cm$^{-2}$, a DRS may even be necessary to render the JTE of any importance.

Furthermore, the reliability and long term stability are improved. This is due to the reduction of the electric field in the SiC material at the periphery of the junction. The maximum surface electric field must be reduced by at least one order of magnitude as long as the passivation schemes known from Si technology are used. Taking the indicated measures relieves the stress inflicted on the passivation and isolation of the junction.

The SiC semiconductor component is manufactured, according to the invention, by one of the alternative methods described below which have, in common, that the junction within the DRS has increasing total charge and/or effective sheet charge density towards the outer edge of the DRS.

One way to arrive at a DRS with the desired properties is to use ion implantation of the surface surrounding, and a small distance away from, the edge of the defined main pn junction area in discrete steps by means of lithography and masking techniques, where zones surrounding each other and surrounding the main pn junction area, by means of ion implantation, are doped to have increasing total charge in the direction away from the main junction (FIG. 1). If this is done in discrete steps, each zone fully implanted to its desired charge content, problems would arise with the alignment of the masks. Although a DRS would be assured at, misalignment of the masks between the steps of the procedure will cause a distribution of the electric field exhibiting high peaks, detrimental to the ability of the junction to block a high voltage. Similar field peaks will appear in the case of gaps between the zones being unimplanted due to mask misalignment.

A low lateral electric field at an interface between a DRS surface and a passivation layer is vital to a proper function of the depletion region stopper design. Unnecessary electric field peaks may be detrimental to the short-term and long-term stability of the component. Hence, a purpose of the invention is to establish a component with a pn junction of SiC where electric field peaks arising from zones of a DRS are reduced to a minimum. This is achieved by forming the stopper with zones or spots having increasing charge content in a direction radially away from the main junction. An advantage with this solution is that the electric field is flattened over the DRS area, while at the same time the DRS stopper function is still maintained. By use of the invention, it is further advantageous to arrive at and to secure a proper termination of the space charge, and to limit the lateral extension of the device.

A first method A of achieving the component according to the invention is arrived at by starting with a silicon carbide wafer comprising a doped layer of a first conducting type. On the plane surface of the wafer, a doped layer of a second conducting type is formed, for example, by ion implantation or epitaxial growth. These two layers constitute the defined main area of a pn junction. A formation of a number of doped zones by means of ion implantation of the first conducting type at the surface of the wafer in its first conducting type region and surrounding the defined main pn junction is carried through at a small distance away from the edge of the main junction or the edge of an established JTE. Consecutive zones of the first conductive type, having increasing total charges and/or effective sheet charge densities, then constitute the DRS.

Due to the costs involved and the complexity of the process if many process steps are used, the method disclosed so far for realizing a DRS gives rise to a limited number of discrete zones having different doping concentrations. Without the diffusion of dopants, the disclosed method still suffers from nonhomogeneities in the charge distribution and, as a consequence, peaks in the electric field distribution occur if the number of zones is too low. In any event, this method suggests a way of accomplishing a stopper for a pn junction for SiC. However, to reduce the height of the peaks, the number of discrete zones has to be increased. The effect of the number of zones on the field reduction and field uniformity saturates, however, with an increasing number of zones. Method A described, is an example of a self-aligning method, where the final doping concentration of each DRS zone is built step-by-step. The linearization of the masks between the implantation steps is not critical in this method, as would be the case if the DRS zones were implanted one-by-one in a single-step implantation procedure per DRS zone.

According to another aspect of the invention, method B, the method for establishing DRS zones with a quasi-homogeneous increasing total charge and/or effective sheet charge density towards the edge is disclosed. This is achieved by single-step or multi-step ion implantation of the device, where the region of the prospective DRS is covered with a mask where discrete zones, with increasing total charge, are formed by open holes, lines or curves of the mask in a pattern defining the areas of the DRS to be implanted in a proper way. This may then be achieved by having greater areas of the openings (holes, lines or curves), or with openings much denser in the outermost portion of the DRS compared to the inner border of the DRS. Between these two limits, the mask pattern is such that the areas exposed during the implantation evenly increase. A smooth change in the effective doping and resulting volume and surface fields is thus achieved. The electric field peaks at the boundaries of the small implanted zones are now of low values. A flat surface electric field profile can be obtained by choosing a proper distribution of the effective surface charge.

The advantages arrived at by an SiC component according to the invention are realization of a reliable Depletion Region Stopper withstanding a blocking voltage of more than 4.5 kV, and that the component is characterized by a low surface field and a high immunity against surface charge, specifically of a negative polarity of on n-type or of a positive polarity on p-type low doped base region.

The stopper design as described above, and as defined in the claims, is capable of handling surface charge in the order of $1 \cdot 10^{13}$ cm$^{-2}$. Even higher densities of negative surface charge (for an n-type surface layer) can be tolerated but will require a redesigning of the charge densities in the DRS zones. Basically, the charge content of the DRS zones will have to be increased, which causes an increase of the characteristic sheet charge density $Q_0$, i.e., the charge density (in Coulombs/cm$^2$) of the highest doped DRS zone.

BRIEF DESCRIPTION OF THE DRAWINGS

FIGS. 4a, 4b, 4c and 4d show an example of the masking and implantation steps for forming a DRS according to the aspect of the invention, where method A1 is used, while

FIG. 5a shows an example of the relation between total charge content of the respective zone of the DRS of FIG. 1, while

FIG. 6b illustrates the electric field concentration laterally over a DRS arrived at with a device according to FIG. 6a.

DETAILED DESCRIPTION OF THE PREFERRED EMBODIMENTS

The invention will be described in a number of embodiments with reference to the drawings.

Figure 1:
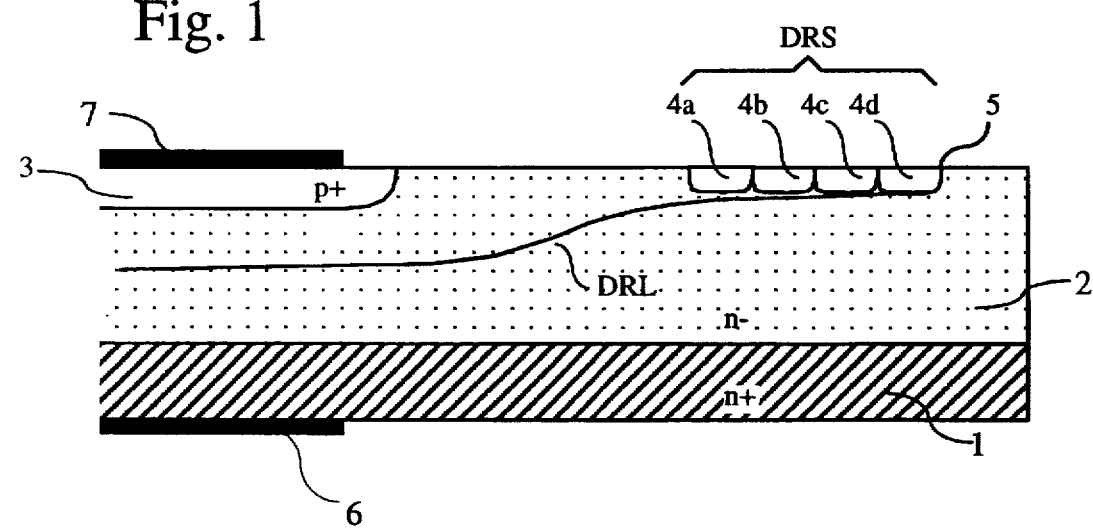
FIG. 1 schematically illustrates a section through a pn junction of a planar semiconductor device on a wafer of SiC material where four zones have increasing dopant content and surround a p-doped anode to form a Depletion Region Stopper, DRS, of the junction.
Figure 2:
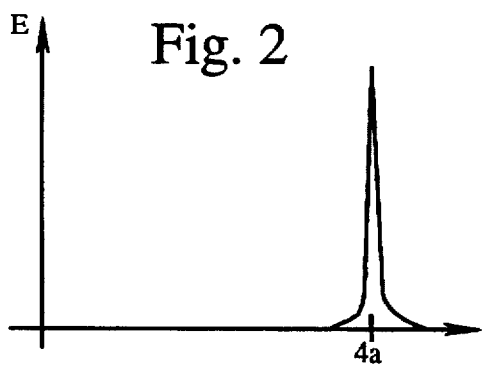
FIG. 2 illustrates the electric field concentration laterally over a stopper design having only one stopper zone.
Figure 3:
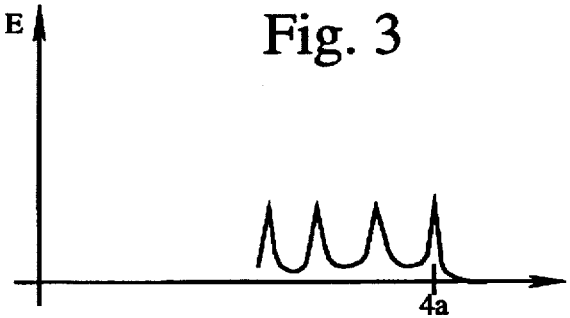
FIG. 3 shows the electric field distribution laterally of a junction, where a self-aligning method has been used to establish a four zone DRS.

FIG. 1 illustrates an example of SiC semiconductor device having a DRS according to the invention. The semiconductor is exemplified by a diode manufactured in SiC. The component of FIG. 1 is built on a substrate of SiC consisting of a highly doped (n+), n-conducting, layer 1 forming a cathode of the diode. On top of this n+layer 1, a first lower doped (n−), n-conducting, layer 2 is established. These two n-conducting layers 1, 2, compose a wafer of a first conducting type of SiC semiconducting material. On the top of the lower doped n-conducting layer 2 an anode formed by a second, highly doped (p+), p-conducting layer 3 is arranged facing the surface of the wafer. The anode is, in FIG. 1, exemplified by a planar surface structure formed by ion implantation, but could as well be composed of a mesa structure p+ anode, formed for example through epitaxial growth of the anode on the wafer. Contacts 6 and 7 contact the cathode and anode, respectively, of the diode. The first, n-conducting layer and the second, p-conducting layer compose a pn-junction, where the interface between the first, n-conducting layer 2 and the second, p-conducting layer 3 define the working area of the pn-junction (here called the main junction), which as far as yet described does not comprise any junction termination extension, JTE. In FIG. 1 a pn junction is shown with a four-zone DRS forming a termination of the junction in the lateral direction, each zone 4a–4d surrounding, at a small distance away, the second conducting layer 3 and being of the same conducting type as the first conducting layer 2. The charge content, and/or effective sheet charge density of the respective zone 4a–4d, increases stepwise in the direction towards the outer DRS edge 5.

Figure 4A:
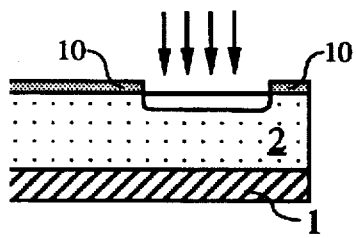
Figure 4B:
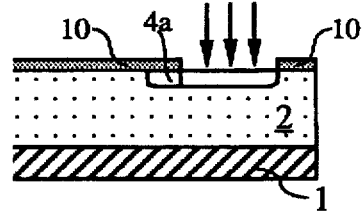
Figure 4C:
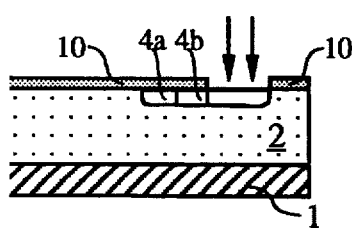
Figure 4D:
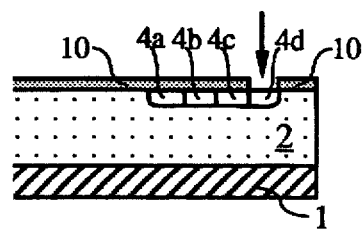
Figure 4E:
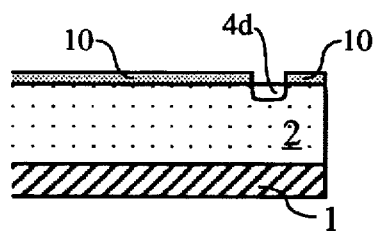
FIGS. 4e to 4h show the implantation steps for forming a DRS by use of method A2.

The semiconductor pn junction of FIG. 1 is, as an example, processed according to a variant of the first method, A1, on a substrate of SiC comprising a highly doped (n+) n-conducting layer 1 and on top of this layer a lower doped first, n-conducting, layer 2. These two n-conducting layers 1, 2 compose a planar wafer of the first conducting type, according to the example n-conducting, on which one or more pn junctions according to the invention can be built. In a second stage, a p-conducting, highly doped second layer 3 is formed on the wafer by means of ion implantation or epitaxial growth technique, where e.g., aluminum, boron or gallium can be used as implants. In a following step, the entire device area of the component except for the prospective DRS area, is masked with a mask 10, see FIG. 4a. The area is exposed to consecutive implantations and decreased step-wise by extending the mask 10 from a first extension, where all of the prospective zones 4a–4d are exposed to radiation. Thereafter, the mask is extended for each stage of the implantation process to cover a DRS zone in a previous stage implanted to its final total charge and/or effective sheet charge density (these two values hereafter together being referred to as the "charge level"). A further dose of implantation will then be allotted to the exposed zones. The procedure is as follows: The entire area of the prospective DRS is implanted by a dopant, giving the surface the same charge as the first conducting type layer 2 up to a dose needed to establish the charge level of the innermost zone, in this example, the charge level of zone 4a. At the next stage, the mask 10 is extended to cover also the innermost zone 4a of the DRS, whereupon an implantation is carried out of the exposed area comprising all the DRS zones uncovered with the dose desired for the next to the innermost DRS zone, in this case zone 4b, to arrive at the charge level of the zone. This step is shown in FIG. 4b. The implantation procedure is repeated in this way until all DRS zones 4a–4d have been implanted, the steps of the procedure being illustrated in FIGS. 4a–4d.

Figure 4F:
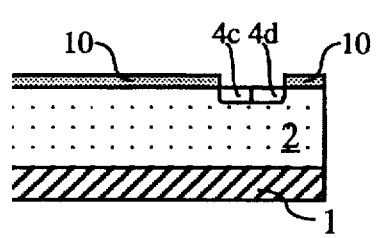
Figure 4G:
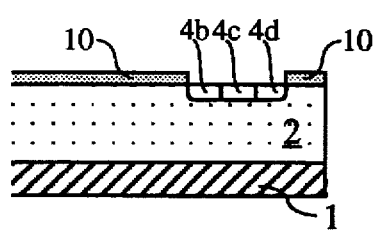
Figure 4H:
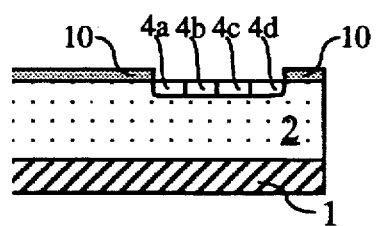

The first method described can also be performed in a reversed way, in method A2 (shown in FIGS. 4e–4h). The entire device area of the component, except for the prospective outermost zone, is masked with a mask 10 (see FIG. 4e). After this step, the outermost DRS zone is implanted with a dopant bestowing the DRS zone with a proper dose of the first conducting type, whereupon the mask 10 is removed from, and uncovers, an area inside, and in connection with the area of the outermost zone 4d, exposes the prospective DRS zone 4c next to the outermost zone. Thereafter, both outer zones 4d and 4c are implanted with a proper dose (FIG. 4f). The masking and implantation procedure is repeated in this way in consecutive steps until the arrival at the desired number of DRS zones 4d–4a. The outermost zone 4d is exposed for every new implantation step, while the innermost zone 4a is implanted only once. The charge level of each zone 4a–4d will, by this method, be the sum of the implantation doses of each step performed.

By the variants A1 and A2 of method A, a stopper design having preferably 1 to 4 self-aligned zones may be arrived at. The total charge and/or effective sheet charge density implanted will increase towards the edge 5 of the termination of a device processed according to these examples.

In a preferred embodiment with four DRS zones, the effective sheet charge density of each DRS zone 4a–4d is expressed by the relation $$Q_1 : Q_2 : Q_3 : Q_4 = 100 : 50 : 35 : 25$$

where $Q_1$ denotes the effective sheet charge density of the outermost zone 4d of the DRS, $Q_2$ the next to the outermost zone 4c, and so on. The value 100 denote the effective sheet charge density of the zone with the highest doping in the DRS design with a four zone embodiment. The value 100 also corresponds to the highest surface charge density the DRS is designed for, herein called the characteristic sheet charge density $Q_0$. Typically, $Q_0 = 1 \cdot 2 \cdot q \cdot N_{scmax}$, where $N_{scmax}$ = maximum surface charge density q=electron charge.

Figure 5A:
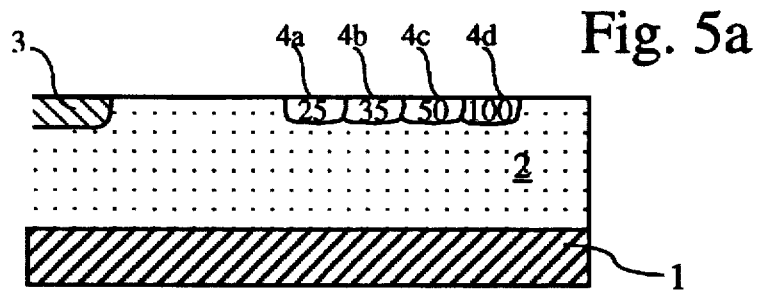
Figure 5B:
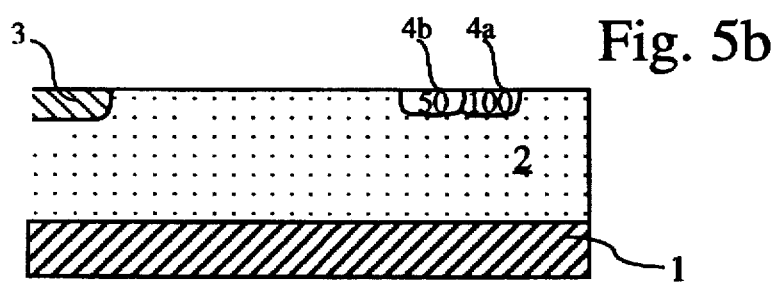
FIG. 5b and FIG. 5c show the same relation for a two-zone DRS and a one-zone DRS, respectively.
Figure 5C:
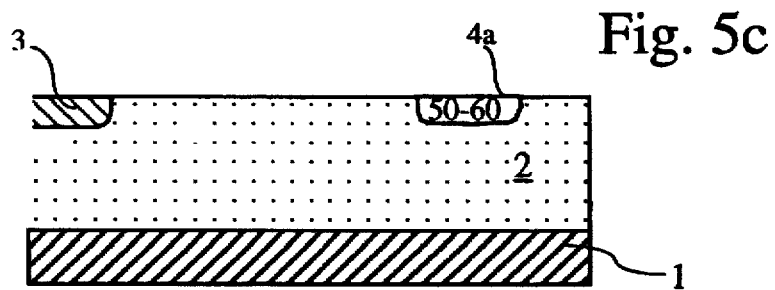

For a two-zone DRS, the relation is expressed as $Q_1 : Q_2 = 100 : 50$, while the effective sheet charge density of a one-zone JTE is 50–60% of the characteristic sheet charge density $Q_0$. The charge densities are also shown in FIGS. 5a–5c.

The effective sheet charge densities for the zones may vary in the intervals given by the expression $Q_1 : Q_2 : Q_3 : Q_4 = 100 : (30–70) : (20–50) : (0–50)$ for a DRS with a four zone embodiment, while the expressions for other embodiments are given by:

three zones: $Q_1 : Q_2 : Q_3 = 100 : (30–80) : (0–50)$
two zones $Q_1 : Q_2 = 100 : (40–70)$
one zone $Q_1 = (40–70)$.

Figure 6A:
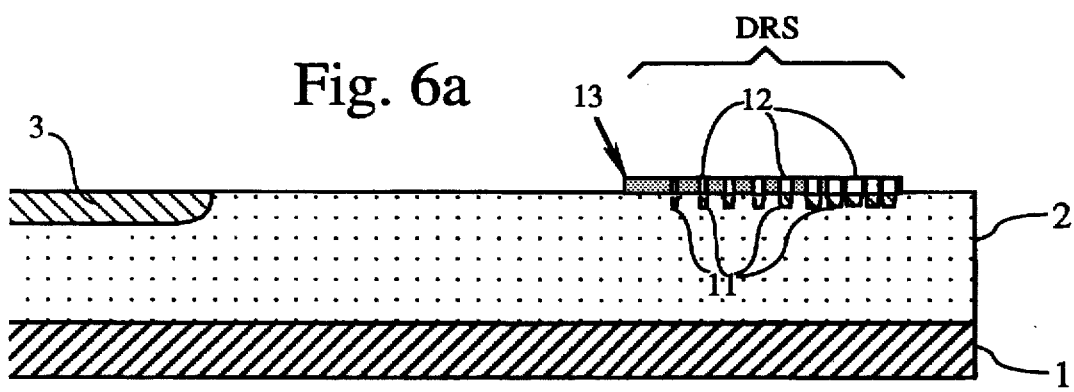
FIG. 6a shows a radial cross-section of an example of a DRS established by use of a masking and implantation procedure (method B), where the mask is designed to give rise to an increase in the fraction of the area of the implanted zones per DRS unit area of the junction counted in the direction radially towards the edge termination.
Figure 6B:
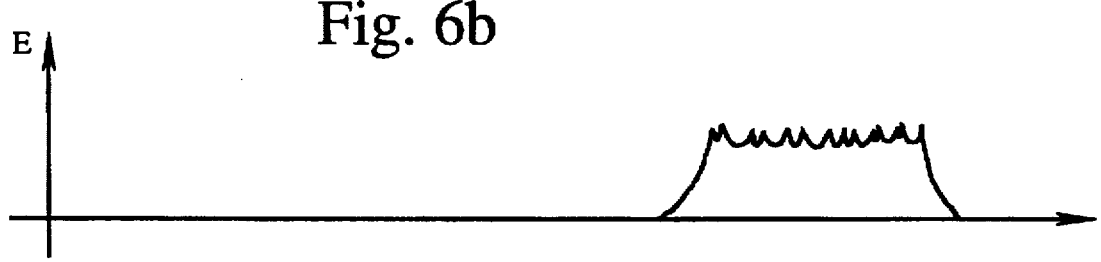

Another embodiment of a semiconductor having a DRS according to the invention is shown in FIG. 6a. A radial cross-section through a pn junction of an SiC semiconductor showing a profile of the DRS of the junction is illustrated. The structure of the pn junction is of the same type as discussed above in relation to FIG. 1. In this case, however, the DRS has a different structure. On top of the lower doped n-conducting layer 2, an anode formed by a second, highly doped, (p+) p-conducting layer 3 (exemplified as a planar surface layer, but could as well be composed of a mesa structure layer) is arranged facing the surface of the wafer. The first n-conducting layer 2 and the second, p-conducting, layer 3 compose a pn-junction, where the interface between the first, n-conducting, layer 2 and the second, p-conducting, layer 3 define the main area of the pn-junction. Surrounding, and at a small distance off the pn junction, there is a DRS comprising a number of spots 11 of the same conducting type as the first conducting type layer 2 of the pn junction. The average charge density in charge per cm$^2$ given by these spots 11 increases in the direction outwardly from the pn junction to the edge 5 of the DRS. This may be achieved in different ways. The areas of the spots are larger towards the edge or, as another example, the distance between the spots is shorter towards the edge 5, the charge content of the spots can be greater towards the edge 5, or a combination of these different measures. FIG. 6b shows an example of the electric field distribution in the lateral direction over the DRS profile given by a proper distribution of the sheet charge density realized as described.

The processing of the DRS of the embodiment shown in FIG. 6a is accomplished in a way similar to the earlier disclosed methods A1 and A2. As an example, the semiconductor is processed on a substrate of SiC comprising a highly doped (n+), n-conducting, layer 1 and, on top of this layer, a lower doped first, n-conducting, layer 2. These two n-conducting layers 1, 2 compose a planar wafer of the first conducting type, according to the example n-conducting, on which one or more pn junctions according to the invention can be built. In a second stage, a p-conducting highly doped second layer 3 is formed on the wafer by means of ion implantation technique, where e.g., aluminum, boron or gallium may be used as implants. At the next stage, a mask (13) with a design defining the areas and positions of the spots 11 by means of holes (12), is arranged on the wafer so that the hole-provided mask (13) covers the area of the prospective DRS. The areas outside the DRS area are totally masked during the process. The wafer is at the surface of the layer 2 of the first conducting type then implanted by a type of ions of the same charge as the charge of layer 2, up to the dose needed to establish the desired charge level of the spots 11 exposed to the radiation. Preferably, the implantation is carried out in one step, but several steps of implantation is, of course, also possible. An annealing step following the implantation of the zones on the wafer, to enable an even better distribution of the charges between the implanted spots, for example, when using boron as an implant, to utilize the benefit of a small occurring diffusion is a way to further improve the process.

A relatively smoothly varying surface charge profile can be realized by this method. Specifically, a charge profile resulting in the uniform distribution of the electric field at the surface as shown in FIG. 6b is readily achieved.

We claim:

1. A semiconductor component comprising a pn junction having a first conductivity type layer and a second conductivity type layer, both being doped layers of silicon carbide (SiC), the first conductivity type layer being lower doped and being provided with a depletion region stopper (DRS) located outside the pn junction, when fully depleted said depletion region stopper (DRS) having stepwise or continuously increasing effective sheet charge density of the first conducting type in a radial direction towards the outer edge of the semiconductor component.

2. A semiconductor component according to claim 1, further comprising a wafer of a first conducting type having a low doped layer at a surface thereof, and a high doped layer of the second conducting type at a limited area of said surface of the wafer, said low doped layer and said high doped layer forming said pn junction, said pn junction being surrounded by said depletion region stopper (DRS) having zones of the first conducting type, the doping levels of said zones or the areas of said zones being so selected that the effective sheet charge density of the depletion region stopper (DRS) increases towards its edge located further from the pn junction.

3. A semiconductor component according to claim 2, further comprising one or more DRS zones contacting each other.

4. A semiconductor component according to claim 3, wherein the effective sheet charge density relations of said DRS zones are:

1) one zone Q1=(40–70)

2) two zones Q1:Q2=100: (40–70)

3) three zones Q1:Q2:Q3=100: (30–80): (0–50)

4) four zones Q1:Q2:Q3:Q4=100: (30–70): (20–50): (0–50), wherein the value 100 corresponds to the characteristic sheet charge density Q0.

5. A semiconductor component according to claim 2, further comprising, discrete DRS zones of said first conducting type, said DRS zones having increasing areas towards the edge of the DRS further away from the pn junction.

6. A semiconductor component according to claim 2, further comprising, discrete DRS zones of said first conducting type, the distance between said DRS zones being smaller towards the edge of the DRS further away from the pn junction.

7. A semiconductor component according to claim 2, further comprising in the DRS region, discrete DRS zones of said first conducting type, the doping levels of said DRS zones increasing towards the edge of the DRS.

8. A semiconductor component comprising a wafer of a first conducting type having a low doped layer at a surface thereof, and a high doped layer of the second conducting type at a limited area of said surface of the wafer, said low doped layer and said high doped layer being made of silicon carbide and forming a pn junction, said pn junction being surrounded by a depletion region stopper (DRS) having zones of the first conducting type, the doping levels of said zones or the areas of said zones being so selected that the effective sheet charge density of the depletion region stopper (DRS), when fully depleted, increases towards the outer edge of the semiconductor component.

* * * * *